(12) United States Patent
Tolksdorf et al.

(10) Patent No.: US 10,074,723 B1
(45) Date of Patent: Sep. 11, 2018

(54) FIELD PLATE TRENCH FET AND A SEMICONDUCTOR COMPONENT

(71) Applicant: Robert Bosch GmbH, Stuttgart (DE)

(72) Inventors: Carolin Tolksdorf, Groembach (DE); Ingo Martini, Fuerth (DE); Frank Lipski, Reutlingen (DE); Timm Hoehr, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 460 days.

(21) Appl. No.: 14/902,147

(22) PCT Filed: May 13, 2014

(86) PCT No.: PCT/EP2014/059703
§ 371 (c)(1),
(2) Date: Dec. 30, 2015

(87) PCT Pub. No.: WO2015/000619
PCT Pub. Date: Jan. 8, 2015

(30) Foreign Application Priority Data

Jul. 3, 2013 (DE) ........................ 10 2013 213 026

(51) Int. Cl.
*H01L 27/148* (2006.01)
*H01L 29/40* (2006.01)
*H01L 29/423* (2006.01)
*H01L 29/10* (2006.01)
*H01L 29/78* (2006.01)
(Continued)

(52) U.S. Cl.
CPC ........ *H01L 29/407* (2013.01); *H01L 29/0646* (2013.01); *H01L 29/0696* (2013.01); *H01L 29/1045* (2013.01); *H01L 29/1087* (2013.01);
*H01L 29/404* (2013.01); *H01L 29/4236* (2013.01); *H01L 29/7813* (2013.01); *H01L 29/7397* (2013.01)

(58) Field of Classification Search
CPC ............ H01L 29/0623; H01L 29/0696; H01L 29/1095; H01L 29/66734; H01L 29/7813; H01L 29/0615; H01L 29/0653; H01L 29/0661; H01L 29/0878; H01L 29/1045; H01L 29/105; H01L 29/404; H01L 29/407
See application file for complete search history.

(56) References Cited

U.S. PATENT DOCUMENTS

| | | |
|---|---|---|
| 2008/0258208 A1 | 10/2008 | Hirler et al. |
| 2009/0189219 A1 | 7/2009 | Shinbori et al. |
| 2010/0032790 A1 | 2/2010 | Rinehimer |

(Continued)

FOREIGN PATENT DOCUMENTS

| | | |
|---|---|---|
| CN | 102130169 A | 7/2011 |
| DE | 10 2010 063 314 | 6/2012 |

(Continued)

*Primary Examiner* — Robert Bachner
(74) *Attorney, Agent, or Firm* — Norton Rose Fulbright US LLP; Gerard Messina

(57) ABSTRACT

A field plate trench FET includes a substrate, a gate buried at least partly within the substrate, and a field plate disposed below the gate, both the gate and the field plate being disposed within a trench in the substrate and being surrounded by an insulator. A p-doped domain is disposed within the substrate below the trench. Also described is a semiconductor component having a substrate and a plurality of field plate trench FETs disposed within the substrate.

9 Claims, 6 Drawing Sheets

(51) Int. Cl.
*H01L 29/06* (2006.01)
*H01L 29/739* (2006.01)

(56) References Cited

U.S. PATENT DOCUMENTS

2011/0227149 A1  9/2011  Hsu
2012/0153386 A1  6/2012  Hirler et al.

FOREIGN PATENT DOCUMENTS

| | | |
|---|---|---|
| JP | H05 7002 | 1/1993 |
| JP | 2010129973 A | 6/2010 |
| JP | 2012064686 A | 3/2012 |
| JP | 2013061474 A | 4/2013 |
| JP | 2014187237 A | 10/2014 |
| TW | 200620679 A | 6/2006 |
| WO | 2009106913 A1 | 9/2009 |
| WO | 2015000619 A1 | 1/2015 |

FIELD PLATE TRENCH FET AND A SEMICONDUCTOR COMPONENT

FIELD OF THE INVENTION

The present invention relates to a field plate trench FET that encompasses a substrate, a gate buried at least partly within the substrate, and a field plate disposed below the gate, both the gate and the field plate being disposed within a trench in the substrate and being surrounded by an insulator; and to a semiconductor element having a plurality of field plate trench FETs.

BACKGROUND INFORMATION

Power transistors are utilized nowadays in a large number of applications. So-called "trench FETs" in particular, i.e. field effect transistors whose structure or so-called "trench gate" is implemented substantially within a trench, and whose channel extends in a vertical direction along that trench gate, are enjoying increasing popularity. Very recently there has been increased use of so-called "field plate" trench FETs which have a field plate disposed vertically, i.e. parallel to the depth of the trench, within the trench and below the gate.

When these field plate trench FETs are switched off, when certain conditions exist they transition into the avalanche breakdown state; in other words, the phenomenon of "avalanche breakdown" occurs in the transistors. This state is usually brought about by a high inductance in the so-called "commutation circuit" of a respective field plate trench FET. In the case of an avalanche breakdown of this kind, the maximum of the electric field existing in the semiconductor, and the site or sites of the breakdown, are respectively located at the lower end of the trench of the field plate trench FET, in regions located alongside the trench of the field plate trench FET.

In the case of an avalanche breakdown within such transistors, the physical proximity of the impact ionization maximum, or the physical proximity of the holes generated in the context of that impact ionization, to the gate oxides or field oxides can result in embedding of the aforesaid charge carriers into the oxides or in damage to the oxides and their surfaces by charge carriers accelerated in the field. Embedding of the charge carriers into the oxides is also referred to as "charge trapping." When breakdown events frequently recur they can result in a degradation of the reverse voltage of the transistor, and ultimately in failure of the component. Components in which corresponding charge carriers are not generated in the immediate vicinity of the oxides are therefore advantageous for applications in which repeated breakdown events occur.

In the existing art this "charge trapping" is avoided by the use of planar components in which the breakdown takes place in the silicon at the P-N transition, i.e. the transition from the so-called "transistor body" or bulk of the transistor to a lightly doped drift zone, so that the charge carriers in question do not reach the oxides located at the surface. For a given active chip area A, however, these planar components exhibit a higher resistance in the drain-source section (also called "Ron") as compared with trench FETs. The product of Ron and A in such planar transistors is thus greater than with trench FETs.

A particularly low product of Ron and A is achieved using aforesaid trench MOSFETs having compensation electrodes.

SUMMARY OF THE INVENTION

The present invention makes available a field plate trench FET that encompasses a substrate, a gate buried at least partly within the substrate, and a field plate disposed below the gate, both the gate and the field plate being disposed within a trench in the substrate and being surrounded by an insulator.

According to the present invention a p-doped domain is disposed within the substrate below the trench.

The advantage of a field plate trench FET of this kind is that in the event of a breakdown therein, the impact ionization maximum is kept away from the trench bottom, i.e. from the bottom of the trench. This maximum, or the site of the breakdown, is instead located in the lower region of the p-n transition of the p-doped domain. Embedding of charge carriers and drift of the component, i.e. the continuous change in important parameters such as the breakdown voltage and service voltage of the component with reference to their respective nominal values, is thereby prevented or reduced.

In an embodiment the p-doped domain is a domain floating within the substrate. In other words, the p-doped domain may be not associated with a constant or fixed electrical potential. In such an embodiment the p-doped domain is decoupled from external electrodes of the field plate trench FET and is thus independent of external electrical potentials present at those electrodes.

The p-doped domain may be electrically conductively connected to the field plate. In other words, the p-doped domain may be at the electrical potential of the field plate of the field plate trench FET. In an exemplifying embodiment of this kind, the region of the avalanche breakdown is more reliably displaced away from the bottom of the trench toward the p-n transition between the substrate and p domain.

Also, the p-doped domain may be electrically conductively connected to the field plate via an electrically conductive path through the insulator located within the trench. An electrically conductive connection of this kind between the p domain and the field plate can be implemented particularly easily using various etching methods.

In an embodiment the field plate trench FET is embodied as a field plate trench MOSFET. Field plate trench MOSFETs are inexpensive and very compact, i.e. can be implemented with a high integration density. In addition, field plate trench MOSFETs exhibit a fast switching time as well as stable gain times and response times.

Also made available is a semiconductor component that encompasses a substrate as well as a plurality of field plate trench FETs according to the present invention disposed within the substrate. With a semiconductor component of this kind, the advantageousness associated with the use of a field plate trench FET according to the present invention can be extended to the entire semiconductor component or even furthermore to an entire chip.

In a refinement of the semiconductor component, the latter furthermore encompasses at least one trench FET that encompasses a substrate as well as at least one gate buried partly within the substrate, the gate being disposed within a trench and being surrounded by an insulator. In other words, the semiconductor component furthermore may have at least one trench FET of the existing art not having a p-doped domain.

The semiconductor component may have a plurality of trench FETs, one trench FET being respectively disposed directly next to one field plate trench FET according to the present invention. With semiconductor components embodied in this fashion the breakdown site is linked, in a majority of the field plate trench FETs, to the p domains of the field plate trench FETs embodied according to the present invention. When considered over the entire semiconductor component, the product of Ron and A, i.e. of the resistance of the drain-source section of the field plate trench FET and the active area A of the semiconductor component, is reduced as compared with an embodiment having a respective p domain below each field plate trench FET.

The semiconductor component may have multiple trench FETs and field plate trench FETs according to the present invention disposed along at least one row, one field plate trench FET according to the present invention following each two trench FETs within the at least one row. In other words, the semiconductor component may have a plurality of trench FETs of the existing art and field plate trench FETs according to the present invention, which are disposed next to one another in a direction perpendicular to the propagation direction of the trenches, extending into the depth of the semiconductor component, of the field plate trench FETs according to the present invention and trench FETs of the existing art. The trench FETs of the existing art and the field plate trench FETs according to the present invention may therefore be disposed within the substrate of the semiconductor component next to one another in one row and in a plane parallel to the surface of the semiconductor element. In other words, the trenches of the field plate trench FETs according to the present invention and trench FETs of the existing art disposed next to one another in one row thus may each form a contiguous trench domain made up of those trenches. These trench domains extend perpendicularly to the propagation direction of the trenches of the field plate trench FETs extending into the depth of the semiconductor component. In other words, the trench domains therefore extend parallel to the surface of the semiconductor component. With an embodiment of this kind, the product of the drain-source resistance Ron and the active area A of the semiconductor component is once again reduced as compared with an embodiment according to the present invention in which more p-doped domains are provided for the same number of transistors. In the case of an avalanche breakdown the breakdown site is nevertheless displaced to the respective p-doped domain in one-third of the field plate trench FETs. Also, the semiconductor component may have multiple trench FETs and field plate trench FETs according to the present invention disposed along at least one row, one field plate trench FET according to the present invention following each n trench FETs within the at least one row, where n∈N⁺ and n>2.

One row of trench FETs may be disposed next to one another alternates respectively with one row of field plate trench FETs according to the present invention disposed next to one another, at least some of the p-doped domains of the field plate trench FETs according to the present invention disposed within a respective row being connected to one another to yield a strip extending within the substrate of the semiconductor component. In other words, within the rows of field plate trench FETs according to the present invention disposed next to one another, at least some of the p-doped domains associated with them may be respectively connected to one another to yield a strip made up of a contiguous p-doped domain. These strips each may extend perpendicularly to the propagation direction of the trenches of the field plate trench FETs extending into the depth of the semiconductor component. The strips thus may proceed parallel to the surface of the semiconductor component. By way of such embodiments it is possible to establish accurately the number of transistors, and the particular transistors, in which an action for displacing the breakdown site is taken, and the number of transistors in which the performance of such actions, aimed at increasing the product of the drain-source resistance Ron and the active area A of the semiconductor component, is omitted.

In a refinement of one of the embodiments recited above, at least one of the trench FETs has a field plate disposed within its respective trench, and the at least one trench FET is embodied as a field plate trench FET. In other words, which may be at least one of the trench FETs of the existing art is embodied as a field plate trench FET having no p-doping or p-doped domain below its associated trench. When multiple trench FETs of the existing art are embodied as field plate trench FETs of the existing art, which may be at least some of these field plate trench FETs of the existing art have a respective field plate which is shorter, measured in terms of its length, than the field plate of that field plate trench FET according to the present invention, of the semiconductor component according to the present invention, which has the field plate that is shortest when measured in terms of length. In a refinement of this embodiment, at least some of those field plate trench FETs of the existing art having the shorter field plates, and/or some of the trench FETs of the existing art having no field plate, respectively have a trench that has a lesser depth than the trench of the field plate trench FET according to the present invention, of the semiconductor component according to the present invention, having the least depth.

The substrate may be configured as a semiconductor layer. Also, a further substrate may be located below the semiconductor layer. Additionally, the further substrate below the semiconductor layer may be heavily doped.

In a further embodiment the trenches of at least some of the trench FETs of the existing art each have a depth that is less than the depth of that trench of that field plate trench FET according to the present invention, of the semiconductor component according to the present invention, having the least depth.

In a refinement of one of the preceding embodiments the trenches of at least some of the trench FETs embodied as field plate trench FETs of the existing art each have a depth that is less than the respective depth of the trenches of one or all of the field plate trench FETs according to the present invention, of the semiconductor component according to the present invention, respectively directly adjacent to those field plate trench FETs of the existing art.

In an embodiment that is furthermore particularized, the semiconductor component has at least two trench FETs of the existing art and at least two field plate trench FETs according to the present invention, the trench FETs of the existing art and the field plate trench FETs according to the present invention being disposed arbitrarily with respect to one another within the semiconductor element.

Advantageous refinements of the invention are indicated in the further descriptions herein and described in the description.

Exemplifying embodiments of the invention are explained in further detail with reference to the drawings and to the description which follows.

DETAILED DESCRIPTION

Figure 1:
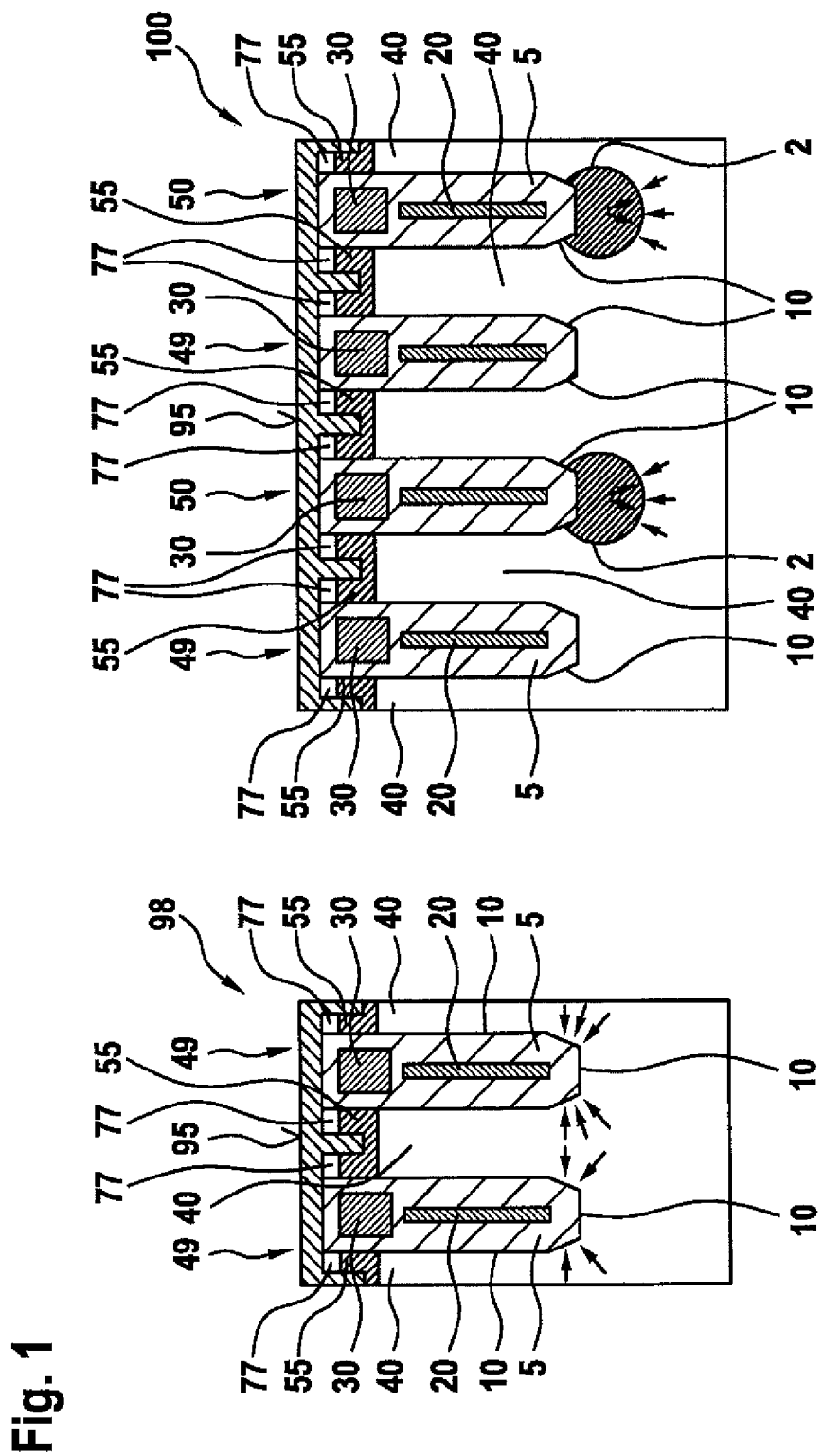
FIG. 1 shows a comparison between a semiconductor component of the existing art and a first exemplifying embodiment of a semiconductor component according to the present invention.

FIG. 1 shows a comparison between a semiconductor component 98 of the existing art and a first exemplifying embodiment of a semiconductor component 100 according to the present invention. Both semiconductor component 98 of the existing art and the first exemplifying embodiment of a semiconductor component 100 according to the present invention are respectively depicted in cross section. Semiconductor component 98 of the existing art, shown on the left in FIG. 1, encompasses two field plate trench FETs 49 of the existing art which each have a substrate 40, a gate 30 buried (in this exemplifying embodiment, purely by way of example, entirely) within substrate 40, and a respective field plate 20 disposed below the respective gate 30 of field plate trench FET 49 of the existing art. Both gate 30 and field plate 20 are respectively disposed within a trench 10 in substrate 40 of the respective field plate trench FET 49 of the existing art, and are respectively surrounded by an insulator 5. Insulator 5 is embodied in this exemplifying embodiment, purely by way of example, as an oxide. Surface 95 of semiconductor component 98 of the existing art is also depicted in FIG. 1. Below trenches 10 of field plate trench FETs 49 of the existing art, on the left in FIG. 1, arrows point toward the regions, sites, or domains in which, in the case of an avalanche breakdown, a respective breakdown occurs below trenches 10 of field plate trench FETs 49 of the existing art. In other words, on the left in FIG. 1 arrows show the regions in which, in the case of an avalanche breakdown, the impact ionization maximum of the charge carriers is located or in which charge trapping can occur, i.e. an undesired embedding of charge carriers into insulator 5 or into the oxide, which is embodied here purely by way of example as a field oxide. In this example, trenches 10 of field plate trench FET 49 of the existing art are recessed or etched into substrate 40 of semiconductor element 98 of the existing art, purely by way of example, perpendicularly to surface 95 thereof.

The first exemplifying embodiment of a semiconductor component 100 according to the present invention, depicted on the right in FIG. 1, has a plurality of field plate trench FETs 50, 49, four of which are depicted on the right in FIG. 1. Of these four field plate trench FETs 50, 49 that are depicted, in this first exemplifying embodiment the first and the third, viewed starting from the left, are field plate trench FETs 49 of the existing art embodied as described above, while the second and the fourth field plate trench FET 50, viewed starting from the left, are exemplifying embodiments of field plate trench FETs 50 according to the present invention.

In other words, the exemplifying embodiment of a semiconductor component 100 according to the present invention depicted on the right in FIG. 1 encompasses a plurality of field plate trench FETs 50, 49 embodied according to the present invention and embodied not according to the present invention, a field plate trench FET 49 of the existing art, embodied not according to the present invention, being respectively disposed directly alongside a field plate trench FET 50 embodied according to the present invention.

The identically labeled constituents on the left in FIG. 1 correspond here to those of the first exemplifying embodiment on the right in FIG. 1, so that what was described previously is thus also to be transferred to the first exemplifying embodiment depicted on the right in FIG. 1. The essential difference between semiconductor component 98 of the existing art depicted on the left in FIG. 1 and the first exemplifying embodiment depicted on the right is that field plate trench FETs 50 embodied according to the present invention each have a p-doped domain 2 below their respective trench 10 within substrate 40. In other words, a respective p-doped domain 2 that, in this first exemplifying embodiment, is adjacent to the respective trenches 10 of its respectively associated field plate trench FETs 50 is provided below trenches 10 of the two field plate trench FETs 50 embodied according to the present invention. The p-doped domains 2 each extend below trenches 10 of their respectively associated field plate trench FETs 50. For field plate trench FETs 50 embodied according to the present invention, arrows likewise point toward the regions, sites, or domains in which a respective breakdown occurs in the case of an avalanche breakdown. In these field plate trench FETs 50 according to the present invention, the domains in which a breakdown occurs are distanced or spaced away from the bottoms of trenches 10.

In this first exemplifying embodiment, p-doped domains 2 of field plate trench FETs 50 according to the present invention are, purely by way of example, domains which float within substrate 40, i.e. which are potential-free, in other words are not associated with a constant or fixed potential. In this first exemplifying embodiment both gates 30, and field plates 20 and substrate 40, of field plate trench FETs 50, 49 are, purely by way of example, n-doped. The aforesaid constituents can also be differently doped, however, in other semiconductor components 100 embodied according to the present invention. In this exemplifying embodiment, field plate trench FETs 50, 49 of semiconductor component 100 according to the present invention furthermore have a respective source domain 77 and a body domain 55 that serve inter alia for application of control to field plate trench FETs 50, 49.

Figure 2:
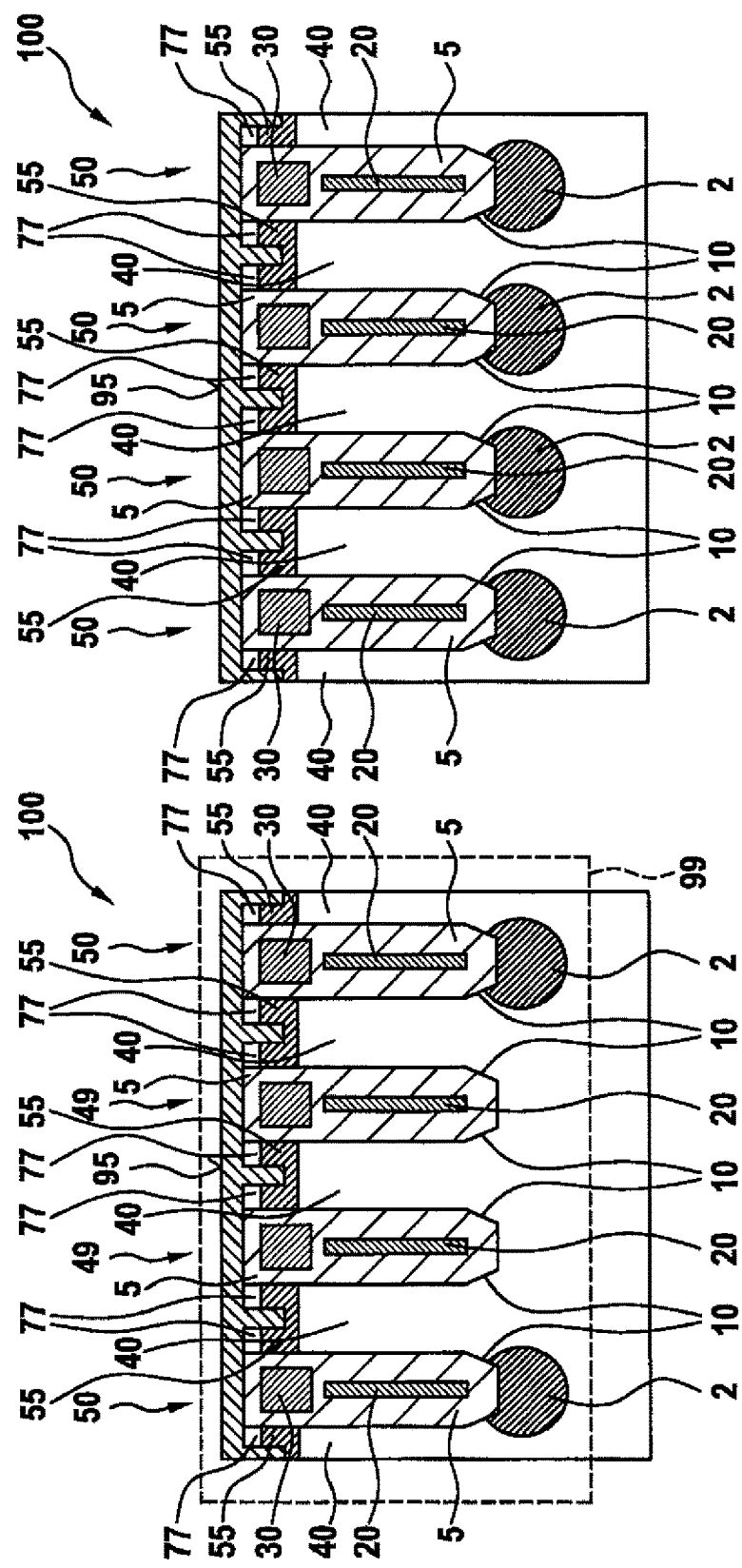
FIG. 2 shows a second and a third exemplifying embodiment of semiconductor components according to the present invention.

FIG. 2 shows a second and a third exemplifying embodiment of semiconductor components 100 according to the present invention. The identically labeled constituents in FIG. 2 correspond to those of the first exemplifying embodiment of FIG. 1, so that what was described therein with reference to those constituents is also to be transferred to the second and the third exemplifying embodiment of FIG. 2. Both the second and the third exemplifying embodiment of semiconductor components 100 according to the present invention respectively have a plurality of field plate trench FETs 50, 49, four of which are respectively depicted for each exemplifying embodiment. In the second exemplifying embodiment depicted on the left in FIG. 2, field plate trench FETs 50, 49 are disposed within one row 99, one field plate trench FET 50 embodied according to the present invention respectively following two field plate trench FETs 49 of the existing art. In the second exemplifying embodiment depicted on the left in FIG. 2, the second and the third transistor, viewed starting from the left, are field plate trench FETs 49 of the existing art, while the first and the fourth transistor, viewed starting from the left, are field plate trench FETs 50 according to the present invention which therefore each have a p-doped domain 2 below their respective trench 10.

In contrast thereto, in the case of the third exemplifying embodiment of a semiconductor component 100 according to the present invention depicted on the right in FIG. 2, each transistor is implemented as a field plate trench FET 50 embodied according to the present invention. In other words, on the right in FIG. 2 a p-doped domain 2 is provided below each field plate trench FET 50.

Figure 3:
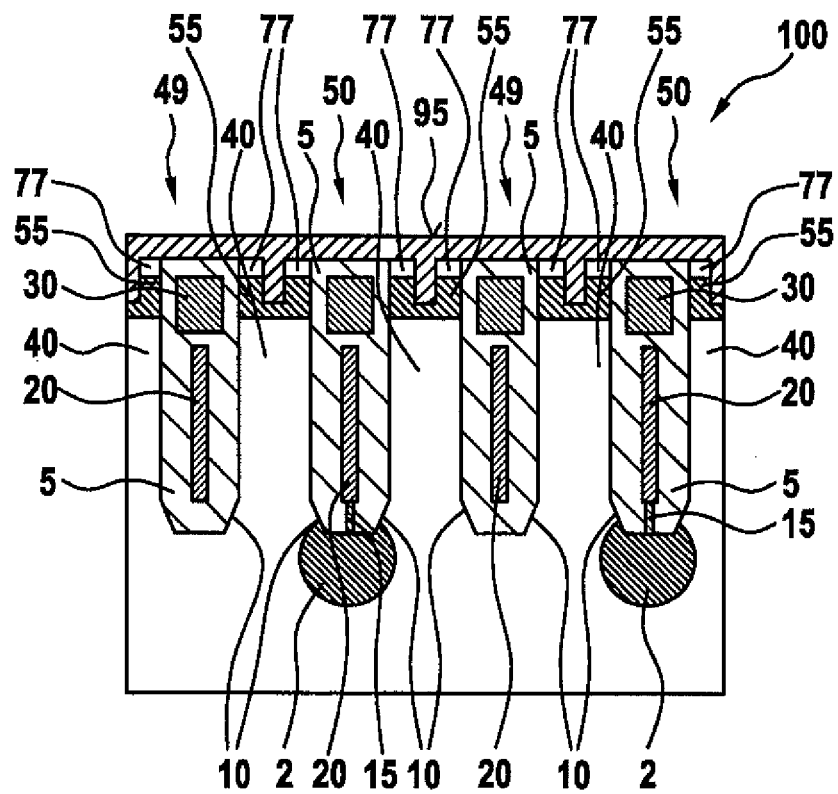
FIG. 3 shows a fourth exemplifying embodiment of a semiconductor component according to the present invention.

FIG. 3 depicts a fourth exemplifying embodiment of a semiconductor component 100 according to the present invention that is, substantially, the first exemplifying embodiment, depicted on the right in FIG. 1, of a semiconductor component 100 according to the present invention. The constituents labeled identically in FIG. 3 thus correspond to those of the first exemplifying embodiment shown on the right in FIG. 1, so that what was described there with reference to these constituents is also to be transferred to the fourth exemplifying embodiment of FIG. 3. The essential difference between the fourth exemplifying embodiment of FIG. 3 and the first exemplifying embodiment depicted on the right in FIG. 1 is that p-doped domains 2 of field plate trench FETs 50 embodied according to the present invention are each electrically conductively connected to field plate 20 of their respective field plate trench FET 50. In other words, in the fourth exemplifying embodiment of a semiconductor component 100 according to the present invention, p-doped domains 2 of field plate trench FETs 50 embodied according to the present invention are each connected to the electrical potential of their respective field plate 20. In this fourth exemplifying embodiment, p-doped domains 2 of the respective field plate trench FETs 50 are each electrically conductively connected to the respective field plate 20, purely by way of example, via an electrically conductive path 15 through insulator 5 located within the respectively associated trench 10. In other words, p-doped domains 2 below field plate trench FETs 50 embodied according to the present invention are electrically conductively connected to field plates 20 of their respective field plate trench FETs 50 via a narrow electrically conductive connection. In this fourth exemplifying embodiment, field plate trench FETs 50 according to the present invention are moreover embodied, purely by way of example, as field plate trench MOSFETs 50.

The p-doped domains 2 below field plate trench FETs 50 according to the present invention do not need to extend entirely along trench 10 of their respectively associated field plate trench FET 50 according to the present invention, but instead can in general exhibit interruptions of arbitrary length at arbitrary sites along trench 10.

Figure 4:
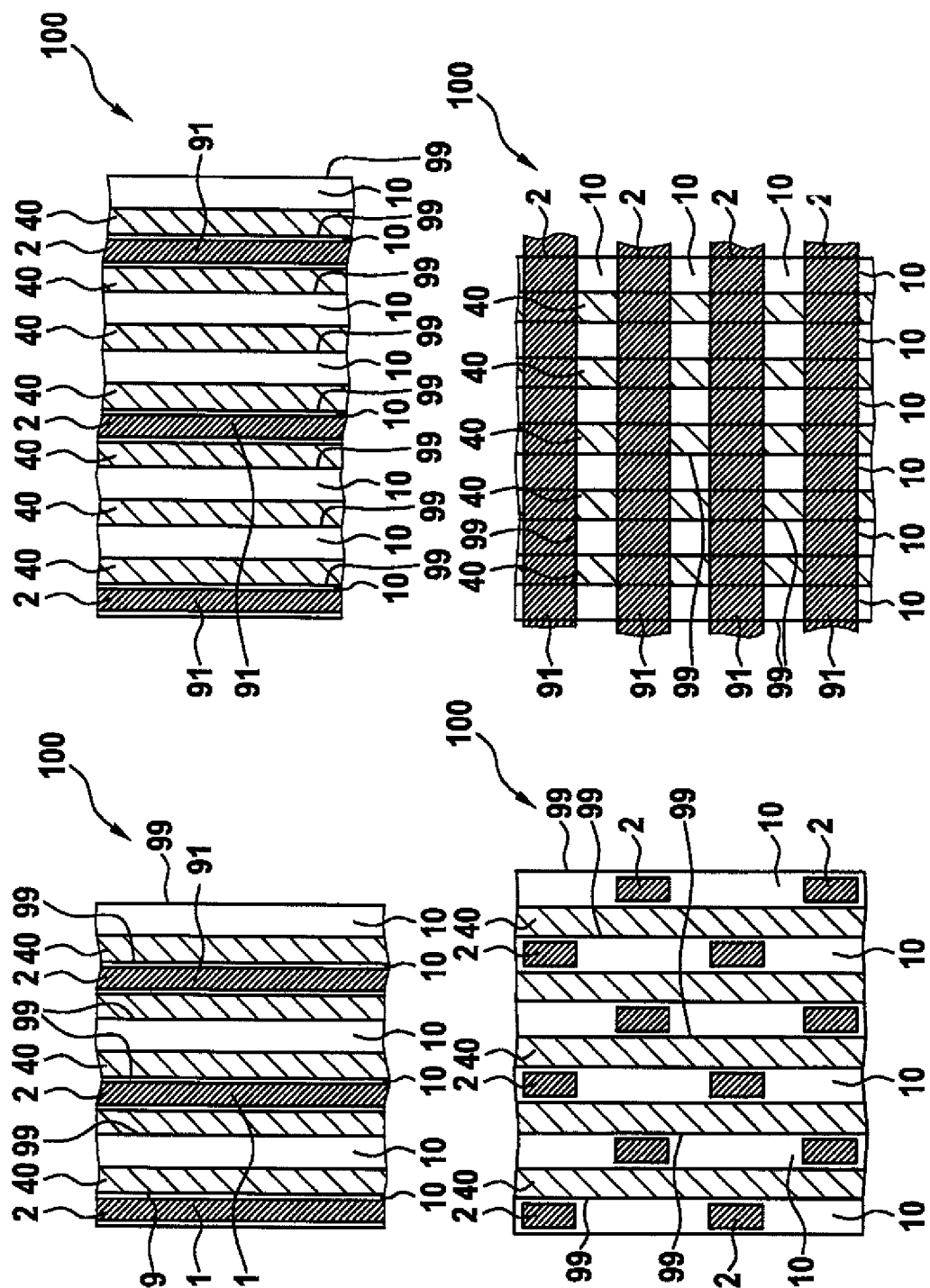
FIG. 4 is a plan view showing four different schematically depicted exemplifying embodiments of layouts for the disposition of field plate trench FETs within semiconductor components embodied according to the present invention.

FIG. 4 is a plan view showing four different schematically depicted exemplifying embodiments of layouts for the disposition of field plate trench FETs 50, 49 within semiconductor components 100 embodied according to the present invention. In these, in the interest of clarity, only trenches 10 of field plate trench FETs 50, 49 formed in substrate 40, as well as p-doped domains 2 of field plate trench FETs 50 embodied according to the present invention, are depicted in a plan view in portions of semiconductor components 100 according to the present invention. Trenches 10 of field plate trench FETs 50, 49 are depicted as light in FIG. 4, while p-doped domains 2 are depicted as dark. In this FIG. 4 and in the following Figures, p-doped domains 2 are not shown accurately to scale. In reality, p-doped domains 2 within semiconductor components 100 according to the present invention can deviate substantially from what is depicted, in terms of their dimensions and their extent.

Shown at the top left in FIG. 4 is a portion of a fifth exemplifying embodiment of a semiconductor component 100 according to the present invention, in which field plate trench FETs 50, 49 are disposed in a plurality of mutually parallel rows 99 disposed each following another. In the fifth exemplifying embodiment depicted at the top left in FIG. 4, field plate trench FETs 50, 49 are thus each disposed next to one another in multiple rows 99, six of which are depicted at the top left in FIG. 4. First row 99, viewed starting from the left, encompasses, purely by way of example, only field plate trench FETs 50 according to the present invention, of which only trenches 10, as well as p-doped domains 2 disposed below trenches 10, are depicted. In this fifth exemplifying embodiment p-doped domains 2 below field plate trench FETs 50 according to the present invention are connected to one another, purely by way of example, to yield a strip 91 extending within substrate 40 of semiconductor component 100. In this fifth exemplifying embodiment, purely by way of example, second row 99 encompasses, viewed starting from the left, only field plate trench FETs 49 of the existing art. Third row 99, viewed starting from the left, is in turn embodied like first row 99, viewed starting from the left, while fourth row 99, viewed starting from the left, is again embodied like second row 99, viewed starting from the left. This disposition pattern continues over the entire fifth exemplifying embodiment of a semiconductor component 100 according to the present invention. In other words, in this fifth exemplifying embodiment one respective row 99 of field plate trench FETs 49 of the existing art always follows one row 99 of field plate trench FETs 50 embodied according to the present invention, and vice versa.

The sixth exemplifying embodiment of a semiconductor component 100 according to the present invention, depicted at the top right in FIG. 4, is substantially the fifth exemplifying embodiment depicted at the top left in FIG. 4; in contrast to the fifth exemplifying embodiment, in this sixth exemplifying embodiment two rows 99 disposed respectively next to one another made up of field plate trench FETs 49 of the existing art respectively disposed next to one another are respectively followed by one row 99 of field plate trench FETs 50 according to the present invention disposed next to one another.

The seventh exemplifying embodiment of a semiconductor component 100 according to the present invention, depicted at the bottom left in FIG. 4, is also substantially the fifth exemplifying embodiment depicted at the top left in FIG. 4; in contrast to the fifth exemplifying embodiment, in this seventh exemplifying embodiment field plate trench FETs 50 embodied according to the present invention are provided in each row 99, each three (purely by way of example) successive field plate trench FETs 50 embodied according to the present invention having p-doped domains 2 connected to one another being respectively followed within rows 99 by a plurality of field plate trench FETs 49 of the existing art. In other words, p-doped domain 2 extending along trenches 10 of field plate trench FETs 50, 49 exhibits interruptions.

In the eighth exemplifying embodiment depicted at the bottom right in FIG. 4, multiple rows 99 encompassing field plate trench FETs 49 of the existing art are disposed vertically and parallel to one another, field plate trench FETs 50 according to the present invention being provided within rows 99 at the same height in each case, i.e. horizontally next to one another across rows 99, p-doped domains 2 of said FETs being respectively connected to one another and thereby forming horizontally extending strips 91 orthogonal to rows 99.

Figure 5:
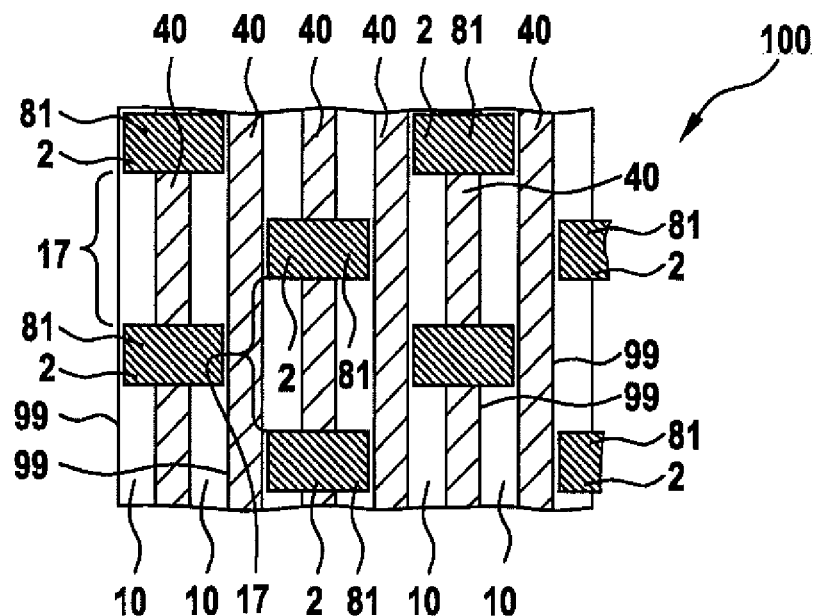
FIG. 5 is a plan view showing two further schematically depicted exemplifying embodiments of layouts for the disposition of field plate trench FETs within semiconductor components embodied according to the present invention.
Figure 5:
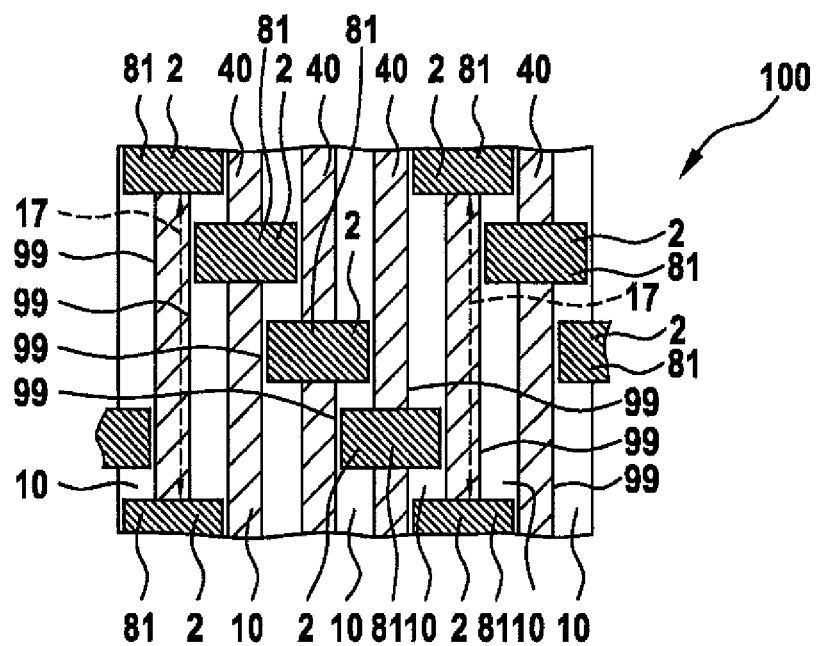

FIG. 5 is a plan view showing two further schematically depicted exemplifying embodiments of layouts for the disposition of field plate trench FETs 50, 49 within semiconductor components 100 embodied according to the present invention.

In these as well, in the interest of clarity, only trenches 10 of field plate trench FETs 50, 49 formed in substrate 40, as well as p-doped domains 2 of field plate trench FETs 50 embodied according to the present invention, are depicted in a plan view in portions of semiconductor components 100 according to the present invention. Trenches 10 of field plate trench FETs 50, 49 are depicted as light in FIG. 5, while p-doped domains 2 are depicted as dark. Both in the ninth exemplifying embodiment of a semiconductor component 100 according to the present invention depicted at the top in FIG. 5 and in the tenth exemplifying embodiment of a semiconductor component 100 according to the present invention depicted at the bottom in FIG. 5, multiple rows 99 of field plate trench FETs 49 of the existing art disposed next to or above one another are provided, which rows are disposed parallel to one another.

In the ninth and tenth exemplifying embodiments depicted respectively at the top and bottom in FIG. 5, along each two adjacent rows 99 at respectively predetermined or predefined and constant vertical spacings 17 from one another, the adjacent transistors of these two rows 99 are respectively embodied as field plate trench FETs 50 according to the present invention whose p-doped domains 2 are respectively connected to one another. In other words, in the ninth and tenth exemplifying embodiments, in a context of two rows 99 respectively directly adjacent to one another at vertically predetermined spacings 17 from one another, within these adjacent rows 99 the adjacent transistors of these two rows 99 are embodied as field plate trench FETs 50 according to the present invention whose p-doped domains 2 each form a bridge 81 between rows 99 respectively disposed directly adjacently to one another. In the ninth exemplifying embodiment depicted at the top in FIG. 5, p-doped domains 2 or bridges 81 formed thereby are disposed with a vertical offset from one row pair to another, one row pair being formed from two directly adjacent rows 99, and p-doped domains 2 or bridges 81 of each two next-but-one row pairs being respectively located at the same height, i.e. respectively traversed by an imaginary line orthogonal to rows 99. In the tenth exemplifying embodiment depicted at the bottom in FIG. 5, bridges 81 made up of p-doped domains 2, and thus field plate trench FETs 50 according to the present invention, are disposed from one row pair to another in such a way that bridges 81, i.e. p-doped domains 2, form a step shape from row 99 to row 99.

Figure 6:
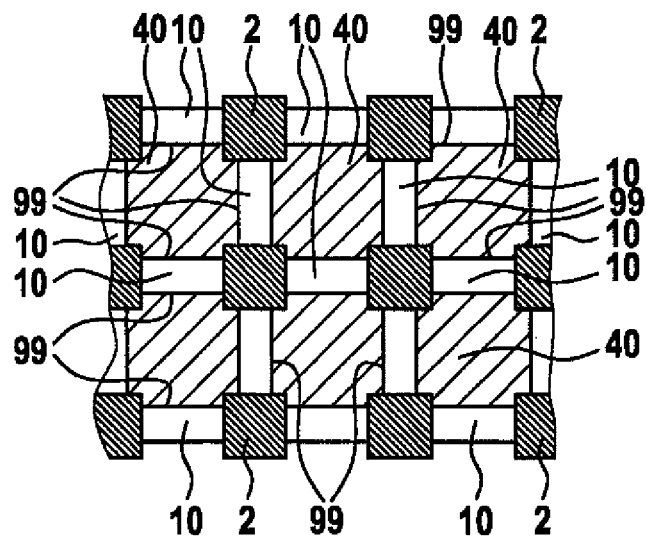
FIG. 6 is a plan view showing three further schematically depicted exemplifying embodiments of layouts for the disposition of field plate trench FETs within semiconductor components embodied according to the present invention.
Figure 6:
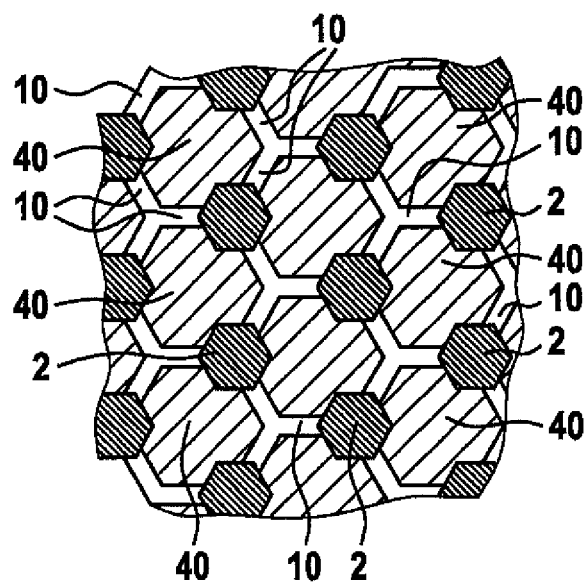
Figure 6:
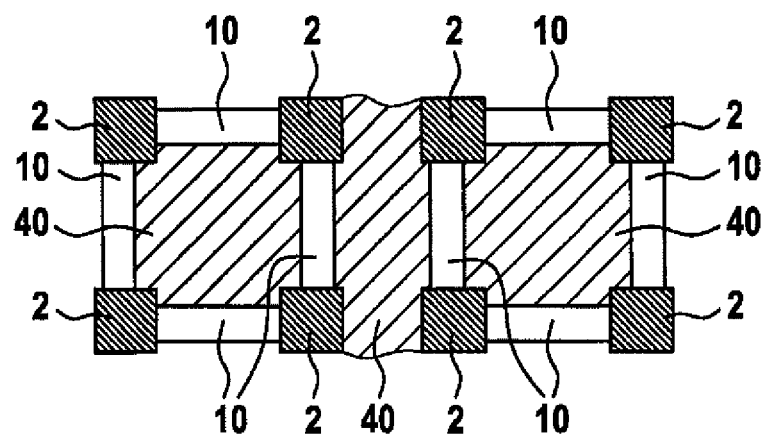

FIG. 6 is a plan view depicting three further schematically depicted exemplifying embodiments of layouts for the disposition of field plate trench FETs 50, 49 within semiconductor components 100 embodied according to the present invention. In these as well, in the interest of clarity, only trenches 10 of field plate trench FETs 50, 49 formed in substrate 40, as well as p-doped domains 2 of field plate trench FETs 50 embodied according to the present invention, are depicted in a plan view in portions of semiconductor components 100 according to the present invention. Trenches 10 of field plate trench FETs 50, 49 are depicted as light in FIG. 6, while p-doped domains 2 are depicted as dark. In the eleventh exemplifying embodiment depicted at the top in FIG. 6, trenches 10 of field plate trench FETs 50, 49, extending horizontally and vertically as well as orthogonally to one another, form a matrix pattern or a grid network structure having rectangles. Rectangularly embodied p-doped domains 2 of field plate trench FETs 50 according to the present invention of semiconductor components 100 according to the present invention are provided at the respective intersection points of trenches 10 extending orthogonally to one another. In the twelfth exemplifying embodiment depicted at the center in FIG. 6, trenches 10 of field plate trench FETs 50, 49 form a honeycomb-shaped structure that has hexagonal honeycombs connected to one another, a likewise hexagonally embodied p-doped domain 2 of field plate trench FETs 50 according to the present invention of semiconductor component 100 according to the present invention being provided, for each honeycomb, at three connecting points of the honeycombs to one another. In the thirteenth exemplifying embodiment depicted at the bottom in FIG. 6, trenches 10 of field plate trench FETs 50, 49 of semiconductor component 100 according to the present invention extend in non-intersecting rectangles at whose corners are disposed p-doped domains 2, likewise embodied rectangularly, of field plate trench FETs 50 according to the present invention of semiconductor component 100 according to the present invention.

In all the exemplifying embodiments described above, it is also possible for only trench FETs 49 of the existing art, i.e. trench FETs 49 of the existing art having no field plate 20, to be provided instead of field plate trench FETs 49 of the existing art. In semiconductor components 100 according to the present invention shown in FIGS. 4 to 6, neither the dimensions or extents of trenches 10, nor the dimensions or extents of p-doped domains 2, are accurately to scale. It is thus possible also to embody semiconductor components 100 according to the present invention in which p-doped domains 2 of field plate trench FETs 50 according to the present invention within semiconductor components 100 according to the present invention are wider than trenches 10.

Substrate 40 can furthermore, in all exemplifying embodiments of semiconductor components 100 which are depicted or described, also be embodied as a semiconductor layer. Furthermore, semiconductor components 100 according to the present invention in which a further substrate 40 is optionally disposed below such a semiconductor layer can be embodied. This further substrate 40 can be, purely by way example, heavily doped. It is thus also possible to embody semiconductor components 100 according to the present invention that are implemented, purely by way of example, in a chip or within the heavily doped support substrate of such a chip. Moreover, however, it is also possible to embody semiconductor components 100 according to the present invention that are implemented, purely by way of example, on a thin wafer or on any other support. Thin wafers of this kind can furthermore, purely by way of example, encompass exclusively a lightly doped semiconductor layer in which field plate trench FETs 50 according to the present invention are implemented. Furthermore, it is also possible to embody semiconductor components 100 according to the present invention having field plate trench FETs 50 according to the present invention which have p-doped domains 2 having a cross section deviating from the depiction and description selected here. For example, the cross section of p-doped domains 2 of field plate trench FETs 50 according to the present invention can also be rounded or circular.

What is claimed is:

1. A field plate trench FET, comprising:
   a substrate;
   a gate buried at least partly within the substrate;
   a field plate disposed below the gate, the gate and the field plate being disposed within a trench in the substrate and being surrounded by an insulator;
   a p-doped domain disposed within the substrate below the trench;
   wherein the p-doped domain is electrically conductively connected to the field plate, the p-doped domain being electrically conductively connected to the field plate via an electrically conductive path through the insulator located within the trench.

2. The field plate trench FET of claim 1, wherein the p-doped domain includes a domain floating within the substrate.

3. The field plate trench FET of claim 1, wherein the field plate trench FET inlcudes a field plate trench MOSFET.

4. A semiconductor component, comprising:
   a main substrate;
   a plurality of field plate trench FETs disposed within the main substrate;
   wherein each of the field plate trench FETs includes:
   a substrate;
   a gate buried at least partly within the substrate;
   a field plate disposed below the gate, the gate and the field plate being disposed within a trench in the substrate and being surrounded by an insulator;
   a p-doped domain disposed within the substrate below the trench;
   wherein the p-doped domain is electrically conductively connected to the field plate, the p-doped domain being electrically conductively connected to the field plate via an electrically conductive path through the insulator located within the trench.

5. The semiconductor component of claim 4, further comprising:
   at least one trench FET having a substrate and at least one gate buried partly within the substrate, the gate being disposed within a trench and being surrounded by an insulator.

6. The semiconductor component of claim 5, further comprising:
   a plurality of trench FETs, one trench FET being respectively disposed directly next to one field plate trench FET having:
   a substrate;
   a gate buried at least partly within the substrate;
   a field plate disposed below the gate, the gate and the field plate being disposed within a trench in the substrate and being surrounded by an insulator;
   a p-doped domain disposed within the substrate below the trench;
   wherein the p-doped domain is electrically conductively connected to the field plate, the p-doped domain being electrically conductively connected to the field plate via an electrically conductive path through the insulator located within the trench.

7. The semiconductor component of claim 5, further comprising:
   a plurality of trench FETs and field plate trench FETs disposed along at least one row, one field plate trench FET following each of two trench FETs within the at least one row, wherein each of the field plate trench FETs includes:
   a substrate;
   a gate buried at least partly within the substrate;
   a field plate disposed below the gate, the gate and the field plate being disposed within a trench in the substrate and being surrounded by an insulator;
   a p-doped domain disposed within the substrate below the trench;
   wherein the p-doped domain is electrically conductively connected to the field plate, the p-doped domain being electrically conductively connected to the field plate via an electrically conductive path through the insulator located within the trench.

8. The semiconductor component of claim 5, wherein one row of the trench FETs is disposed next to one another alternating respectively with one row of the field plate trench FETs disposed next to one another, and wherein at least some of the p-doped domains of the field plate trench FETs are disposed within a respective row being connected to one another to yield a strip extending within the main substrate of the semiconductor component, and wherein each of the field plate trench FETs includes:
   a substrate;
   a gate buried at least partly within the substrate;
   a field plate disposed below the gate, the gate and the field plate being disposed within a trench in the substrate and being surrounded by an insulator;
   a p-doped domain disposed within the substrate below the trench;
   wherein the p-doped domain is electrically conductively connected to the field plate, the p-doped domain being electrically conductively connected to the field plate via an electrically conductive path through the insulator located within the trench.

9. The semiconductor component of claim 4, wherein at least one of the trench FETs includes a field plate disposed within its respective trench and is a field plate trench FET.

* * * * *